United States Patent [19]
Hsu

[11] Patent Number: 5,932,913
[45] Date of Patent: *Aug. 3, 1999

[54] MOS TRANSISTOR WITH CONTROLLED SHALLOW SOURCE/DRAIN JUNCTION, SOURCE/DRAIN STRAP PORTIONS, AND SOURCE/DRAIN ELECTRODES ON FIELD INSULATION LAYERS

[75] Inventor: Sheng Teng Hsu, Camas, Wash.

[73] Assignees: Sharp Microelectronics Technology, Inc., Camas, Wash.; Sharp Kabushiki Kaisha, Osaka, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/847,916

[22] Filed: Apr. 28, 1997

Related U.S. Application Data

[60] Division of application No. 08/616,561, Mar. 15, 1996, Pat. No. 5,672,530, which is a continuation-in-part of application No. 08/335,112, Nov. 7, 1994, abandoned, which is a continuation of application No. 08/034,093, Mar. 22, 1993, abandoned.

[51] Int. Cl.⁶ .................................................. H01L 29/784
[52] U.S. Cl. .............................. 257/347; 257/52; 257/57; 257/66; 257/69; 257/349; 257/350; 257/351; 257/352
[58] Field of Search .................................. 257/51, 52, 57, 257/66, 69, 343, 349, 377, 382, 383, 385, 395, 505, 133, 192, 413, 408

[56] References Cited

U.S. PATENT DOCUMENTS

| | | | |
|---|---|---|---|
| 5,242,847 | 9/1993 | Ozturk et al. | 437/41 |
| 5,298,782 | 3/1994 | Sundaresan | 257/67 |
| 5,314,832 | 5/1994 | Deleonibus | 437/27 |
| 5,316,977 | 5/1994 | Kunishima et al. | 437/200 |
| 5,342,796 | 8/1994 | Ahn et al. | 437/41 |
| 5,352,631 | 10/1994 | Sitaram et al. | 437/200 |
| 5,581,102 | 12/1996 | Kusumoto | 257/347 |

FOREIGN PATENT DOCUMENTS

| | | |
|---|---|---|
| 54-159185 | 12/1979 | Japan . |
| 58-33871 | 2/1983 | Japan . |
| 60-103671 | 6/1985 | Japan . |
| 1-105576 | 4/1989 | Japan . |
| 1-274474 | 11/1989 | Japan . |

*Primary Examiner*—Fetsum Abraham
*Attorney, Agent, or Firm*—David C. Ripma; Gerald W. Maliszewski

[57] ABSTRACT

The invention provides an improved technique for forming a MOS transistor having lightly doped source and drain junction regions and low parasitic capacitance. The transistor includes raised source and drain electrodes which are strapped to the substrate adjacent the gate insulation. The raised electrodes include interconnect portions which overlie the field oxide separating the semiconductor substrate into a plurality of active regions. The source and drain electrodes are thickest where each overlies its junction with the substrate in order to control the depth of penetration of doping impurities into the substrate. After doping the electrodes, a rapid thermal anneal is performed which diffuses the doping impurities throughout the electrodes and into thin junction regions of the substrate, immediately beneath the source and drain electrodes. The thickness of the junction regions and the impurity concentration in each region is determined by the length of the diffusion anneal and the thickness of the overlying electrode. Lightly doped junction regions are formed in the substrate, between the source/drain electrodes and the channel, each junction region having a depth which is a fraction of the thickness of the overlying electrode strap, based on the substantially lower rate of impurity diffusion through single crystal silicon versus polycrystalline silicon. The thin, lightly-doped junction regions increase the breakdown voltage of the device.

10 Claims, 4 Drawing Sheets

MOS TRANSISTOR WITH CONTROLLED SHALLOW SOURCE/DRAIN JUNCTION, SOURCE/DRAIN STRAP PORTIONS, AND SOURCE/DRAIN ELECTRODES ON FIELD INSULATION LAYERS

BACKGROUND AND SUMMARY OF THE INVENTION

The application is a divisional of application Ser. No. 08/616,561, filed Mar. 15, 1996, which is U.S. Pat No. 5,672,530 is a continuation-in-part of application Ser. No. 08/335,112, filed on Nov. 7, 1994, abandoned, which is a continuation of application Ser. No. 08/034,093, filed Mar. 22, 1993 abandoned.

The invention relates generally to semiconductor devices and fabrication methods and, more particularly, to a MOS transistor and fabrication method which minimizes parasitic capacitance and improves voltage breakdown performance in MOS transistors.

Metal oxide semiconductor ("MOS") transistors are widely used in high density integrated circuits in part because MOS processing techniques yield high packing densities. When fabricating MOS transistors, the source and drain electrodes are usually heavily doped to reduce the parasitic resistance of the device. Such heavy doping of the source/drain electrodes improves conductance but also increases the parasitic capacitance of the device, and lowers its breakdown voltage. One prior art solution to the problem of low breakdown voltage is to form lightly doped semiconductor regions that are interposed between the heavily doped source/drain electrodes and the channel region of the device. This solution requires additional masking and processing steps which increase manufacturing costs and can potentially reduce yield.

The parasitic capacitance and parasitic resistance of MOS transistors combine to form a time constant which reduces the speed and operating frequency of the device. Parasitic capacitance in a MOS transistor is directly related to the junction area between the heavily-doped source and drain regions and the substrate. As noted above, the parasitic resistance can be reduced to some extent by increased doping levels although the advantage is offset by the need to provide lightly doped regions adjacent the channel in order to maintain an acceptable breakdown voltage level. A MOS transistor used in high-speed switching applications preferably has low parasitic capacitance and resistance values and a breakdown voltage sufficiently high to switch the signals it controls. These performance parameters represent design trade-offs well known to those skilled in the art of MOS transistor fabrication.

Because of the many applications of MOS transistors in high-density integrated circuitry, there is a continuing need in the industry for improved transistor designs and fabrication methods which maximize the switching speed of the devices while maintaining acceptable breakdown voltage performance.

It would be advantageous to provide a MOS transistor wherein the junction area between doped regions and undoped regions is minimized, thereby reducing the parasitic capacitance of the device.

It would also be advantageous to provide a MOS transistor with lightly doped regions adjacent the channel of the device to improve breakdown voltage performance without the need for separate masking or other fabrication steps to create such lightly doped regions.

Accordingly, a MOS transistor is provided comprising a substrate which includes single crystal silicon having an active region where the transistor is formed. A gate is provided in the active region, including gate insulation on the substrate and a gate electrode on the gate insulation. The gate is formed of polycrystalline silicon implanted with doping impurities which are diffused through the polycrystalline silicon. Source and drain electrodes are also provided on the substrate. The source and drain electrodes are formed of polycrystalline silicon implanted with suitable doping impurities which are diffused through the polycrystalline silicon. The gate electrode is positioned between the source and drain electrodes and is electrically insulated therefrom. A source junction region is provided in the substrate adjacent the source electrode. The source junction region includes doping impurities which have been diffused into the substrate from the source electrode. A drain junction region is provided in the substrate adjacent the drain electrode. The drain junction region includes doping impurities which have been diffused into the substrate from the drain electrode. The portions of the source and drain electrodes which are immediately adjacent and which overlie the respective source and drain junction regions each have a predetermined electrode thickness. The electrode thickness of each source and drain electrode in the region overlying the respective source and drain junctions determines the depth to which doping impurities diffuse into the source and drain junction regions. Specifically, the depth of each source and drain junction region is a small faction of the thickness of the overlying source and drain electrodes. That is because doping impurities diffuse at a substantially lower rate through single crystal silicon, as compared with the diffusion of doping impurities through polycrystalline silicon. Thus, during the time it takes for the doping impurities to diffuse through the source and drain electrodes, the doping impurities diffuse only a short distance into the underlying single crystal silicon substrate. In consequence, the source and drain junction regions within the substrate are thin in comparison with the thickness of the overlying source and drain electrodes. The thin source and drain junction regions each have a higher sheet resistance than the sheet resistance of the source and drain electrodes, and that higher sheet resistance serves to increase the breakdown voltage of the transistor.

In its preferred form, the MOS transistor of the present invention includes source and drain electrodes which each have a thickness, immediately overlying each respective source and drain junction region, generally in the range of 2,000-angstroms (Å) to 5,000-angstroms. The polycrystalline silicon which forms each source/drain electrode is preferably implanted with a heavy dose of doping impurities generally in the range of $1\times10^{15}$ to $1\times10^{16}$ ions/cm$^2$. A device with polycrystalline silicon electrodes of that depth, if processed using rapid thermal annealing ("RTA") at approximately 1050° C. to 1150° C. for less than 40 seconds, will cause the doping impurities to diffuse into the substrate to produce the desired source/drain junction regions. The depth of each source/drain junction region within the substrate, i.e., the depth to which the impurities diffuse in useful concentrations within the single-crystal silicon, is generally between 100-and 1,000-angstroms and, more typically, less than 500-angstroms.

The silicon substrate on which the MOS transistor is formed is divided into multiple active areas, each separated by insulating material (i.e., field oxide or field insulation) which extends into the substrate. The source/drain electrodes of the illustrated embodiment of the invention each additionally includes a raised interconnect portion which is operatively connected to the electrode. The interconnect portions of the electrodes are formed on the field insulation.

That minimizes the junction area between the electrodes and the silicon substrate, thereby reducing the parasitic capacitance of the device.

The invention also provides a method of forming a MOS transistor on a substrate of single crystal silicon. The method compromises steps which include depositing gate insulation on a substrate of single crystal silicon. Polycrystalline silicone is deposited on the gate insulation to provide a gate electrode, and insulating side walls are provided on the sides of the gate electrode. Polycrystalline silicon is deposited on the substrate to a predetermined thickness adjacent one side wall of the gate electrode to form a source electrode. Polycrystalline silicon is deposited to a predetermined thickness on another side wall of the gate electrode, preferably opposite the source electrode, to form a drain electrode. The source electrode contacts the substrate at a source junction region and the drain electrode contacts the substrate at a drain junction region. Doping impurities are then implanted into the electrodes. The implanted doping impurities are then diffused. The diffusion step includes diffusing doping impurities through the source and drain electrodes and into the respective source and drain junction regions of the substrate, to an effective depth in the substrate. The effective depth to which the doping impurities are diffused in the substrate, in each said source/drain junction region, is referred to as the junction depth. The junction depth is small in comparison with the thickness of the source and drain electrodes immediately overlying the respective junction regions; the thickness of each electrode being predetermined to control the depth of the junction regions. The reason the junction depth is small in comparison with the electrode thickness is because doping impurities diffuse through single crystal silicon at a substantially slower rate than through polycrystalline silicon. The method produces source and drain electrodes which each have a predetermined thickness, and produces substantially thinner source and drain junction regions (in the substrate) immediately beneath the respective source and drain electrodes.

The step of depositing polycrystalline silicon on the substrate to produce the source/drain electrodes preferably includes depositing polycrystalline silicon to form the electrodes to a predetermined electrode thickness which is generally in the range of 2,000-angstroms to 5,000-angstroms. The implanting step in which doping impurities are implanted in the source/drain electrodes includes implanting a dose of the appropriate doping impurities for the device, the dose being generally in the range of $1\times10^{15}$ to $1\times10^{16}$ ions/cm$^2$. The diffusion step preferably employs rapid thermal annealing (RTA) at a temperature generally in the range of 1050° C. to 1150° C. for approximately 5 to 40 it being understood that longer anneal times within that general range are used if the anneal is performed at a lower temperature in the general temperature range specified, and that shorter anneal times within that general range are used if the anneal is performed at a higher temperature in the general temperature range specified.

The thickness of the deposited polycrystalline silicon immediately overlying the source/drain junction regions, together with the above-described implanting and diffusion steps, controls the thickness of each source and drain junction region. As such, thin junction regions are produced which are lightly doped in comparison with the electrodes. The thin, lightly-doped junction regions minimize parasitic resistance in the device while maintaining an acceptable breakdown voltage.

DETAILED DESCRIPTION OF THE PREFERRED EMBODIMENT

Figure 1:
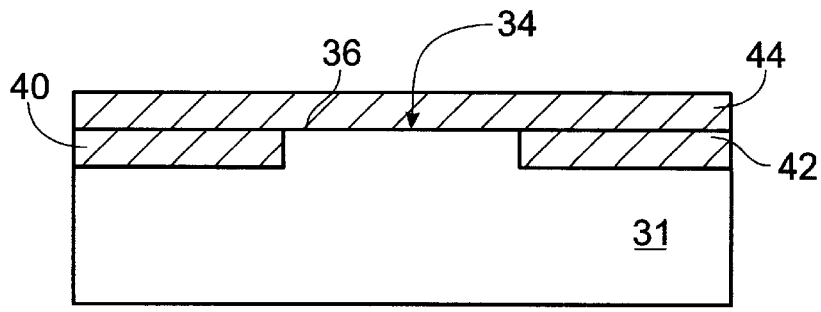
FIG. 1–10 illustrates steps in the fabrication of a MOS transistor shallow/source drain junction regions in accordance with present invention.

FIG. 1 is a schematic cross-sectional view of a portion of a single-crystal silicon substrate 31. The portion of substrate 31 shown in FIG. 1 is the area where a MOS transistor is to be fabricated in accordance with the present invention. Substrate 31 is lightly doped with dopant impurities of the desired background polarity. An active region 34 is illustrated centrally on the top surface 36 of substrate 31. A silicon wafer typically includes a large plurality of such active regions 34, each active region being isolated from adjacent active regions (not shown) by means of trench isolation. As shown in FIG. 1, active region 34 is bordered by field insulation regions 40, 42 in the form of trenches extending a suitable distance into the substrate from top surface 36. The trenches are filled with silicon dioxide or a similar insulating material. The purpose of the trenches is to isolate active region 34 from adjacent active regions, and the depth of the trenches which, when filled, form insulating regions 40, 42, is a matter of design choice well known in the art of silicon wafer processing. Insulation-filled trenches 40, 42 are referred to herein as field insulation regions or, alternatively, as field oxide regions 40, 42.

Each active region 34 on a wafer may be processed to subsequently contain a n-channel or p-channel device, depending on the desired application. As is well known to those skilled in the art, threshold voltage adjustment for each active region 34 is accomplished through implantations of selected materials to provide the desired threshold voltage for the device. After threshold voltage adjustment, a layer of oxide or another suitable insulating material 44 is grown or deposited on substrate 31 to provide the gate oxide or gate insulation layer 44 between the gate electrode (to be formed later) and the channel region of the transistor. In addition to covering active region 34, gate insulation layer 44 extends over field insulation regions 40, 42. The thickness of gate insulation layer 44 should generally be between 40-angstroms to 500-angstroms, and will typically be approximately 200-angstroms thick. Because gate insulation layer 44 and field insulation regions 40, 42 are customarily the same material, i.e., silicon dioxide, in several subsequent figures the insulation material forming regions 40, 42 and layer 44 are merged, with only a dashed line separating them, and in the final device the merged insulation material is collectively referred to as field insulation regions 40, 42.

Figure 2:
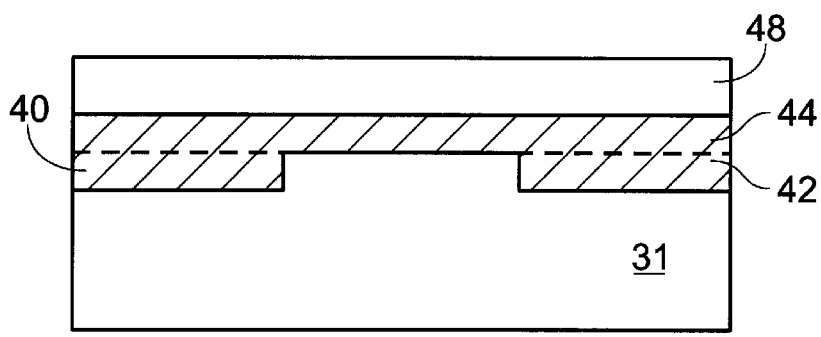

In FIG. 2, a layer 48 of semiconductor material, preferably polycrystalline silicon, is deposited or formed on gate oxide layer 44. The polycrystalline silicon (alternatively known in the art as "polysilicon") 48 is formed by any well-known technique to a thickness of approximately 2,000- to 4,000-angstroms.

Figure 3:
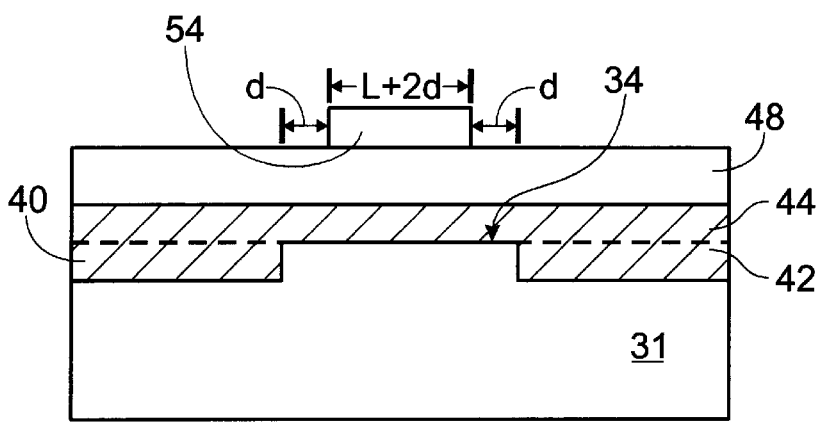
Figure 4:
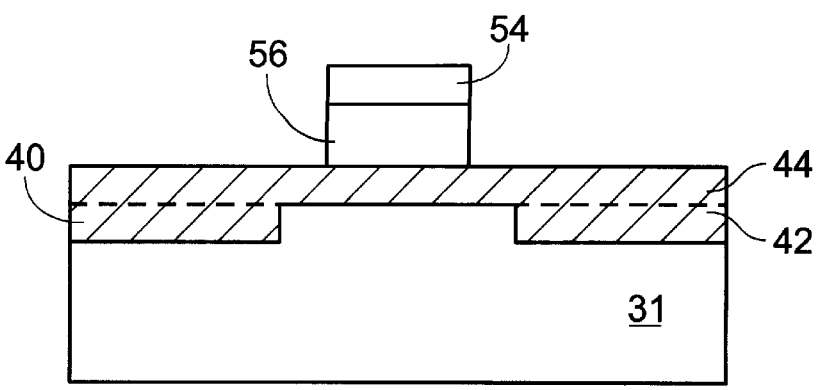

The next step, illustrated in FIG. 3, is to form a photoresist mask 54 on polycrystalline silicon layer 48 for the purpose of defining an extended gate area. Resist mask 54 is centrally positioned over the active area 34 on substrate 31 and has an overall length of L+2d, where L equals the channel length and d is the alignment tolerance for positioning the gate electrode on the substrate. FIG. 4 shows the result after an anisotropic plasma etch is performed, removing selected portions of polycrystalline silicon layer 48 down to insulating layer 44, except for the portion of gate silicon 56 underlying the extended gate resist 54.

Figure 5:
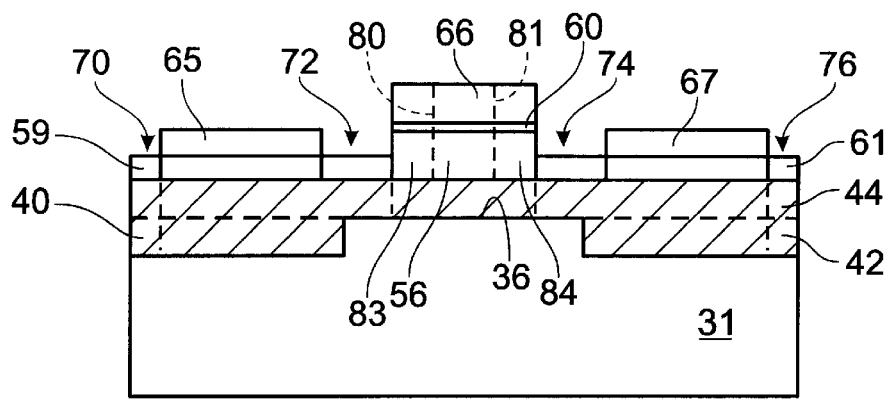

FIG. 5 illustrates the result of several additional photolithographic and etching steps. Resist layer 54 is removed from the gate polycrystalline silicon 56 (FIG. 4) and layer of polycrystalline silicon is formed or deposited on the exposed gate oxide 44 and gate silicon 56. The added polycrystalline silicon is shown in FIG. 5 at 59, 60, and 61. Each segment has a thickness generally in the range of 500-angstroms to 1,000-angstroms. A photoresist mask is then applied to portions of the polycrystalline silicon. The mask has segments 65, 66, 67. A plasma etch is then undertaken to remove polycrystalline silicon and some of the underlying insulating material from the exposed (i.e., unmasked) regions 70, 72, 74, 76. In regions 72, 74, the etch should reach, and may even extend slightly into, substrate 31. It is necessary that the substrate 31 be exposed in regions 72, 74 and a slight over etch into the substrate will not adversely effect the resultant device. Finally, corner portions of mask segment 66 (to the left of dashed line 80 and the right of dashed line 81 in FIG. 5) are removed, or a new mask is applied, in order to remove the side segments 83, 84 of extended gate 56. The remaining resist segments 65, 66, 67 are then removed to yield the structure illustrated in FIG. 6.

Figure 6:
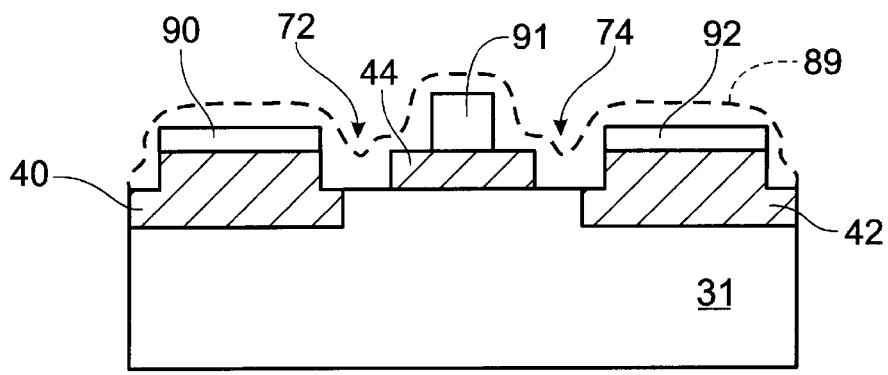
Figure 7:
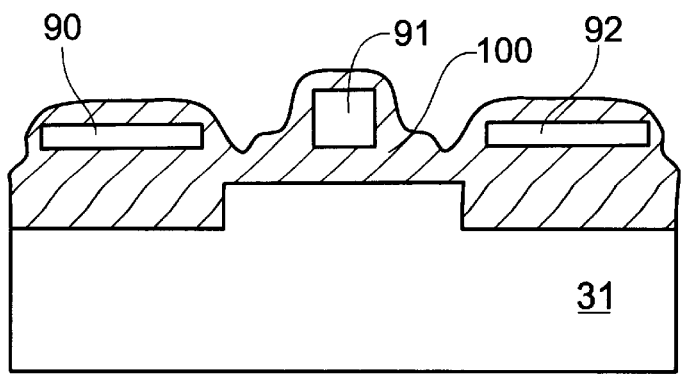

FIGS. 6 and 7 show the formation or deposition of a layer of oxide 89 or another suitable insulating material over the entire surface of the structure. The insulation is applied to a thickness of approximately 150-angstroms. Oxide layer 89 forms with the remaining portions of gate oxide layer 44 and underlying field oxide segments 40, 42 to form one continuous body of oxide 100, as shown in FIG. 7. The plasma etch steps described above with reference to FIG. 5 yielded three separated polycrystalline silicon segments 90, 91, and 92 which are surrounded by insulation 100. The central segment 91 will become part of the gate electrode. Segment 90, 92 will become parts of the source and drain electrodes, respectively.

Figure 8:
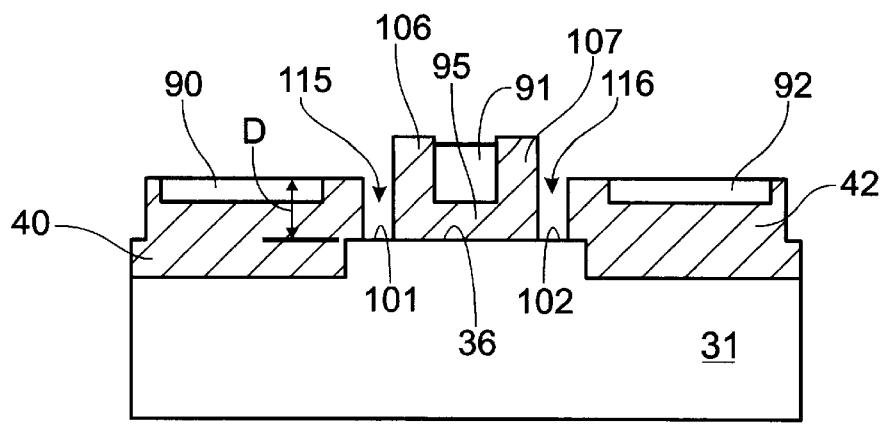

An anisotropic plasma etch is then performed on the structure shown in FIG. 7 to yield the structure shown in FIG. 8. As is well known in the art, an anisotropic plasma etch removes material from horizontal surfaces while retaining material on vertical surfaces. As a result of the plasma etch, the insulation is divided into three segments and the tops of the source, gate, and drain electrodes 90, 91, 92, respectively, are exposed, as well as surface areas 101, 102 of substrate 31. The middle segment of insulating material is the gate insulation 95, which now includes insulating side walls 106, 107. Beneath and along the sides of exposed polycrystalline silicon segment 90 is an insulation region which will hereinafter be referred to as field insulation 40. Beneath and along the sides of exposed polycrystalline silicon segment 92 is another insulation region which will hereinafter be referred to as field insulation 42.

The vertical gap in the oxide above exposed substrate surface area 101, between the gate insulation side wall 106 and field insulation 40, is referred to as the source gap 115. The gap in the oxide above exposed substrate surface area 102, between gate insulation side wall 107 and field insulation 42, is referred to as the drain gap 116. Source and drain gaps 115, 116 will subsequently be filed with semiconductor material which is doped to form, respectively, the strap portions of the source and drain electrodes of the transistor. The depth of gaps 115, 116 establishes the overall thickness of the source and drain electrode straps which overlie substrate surface areas 101, 102, respectively. The thickness of the semiconductor material deposited in gaps 115, 116 (i.e., the height of the semiconductor material measured generally perpendicularly to surfaces 101, 102) is important to the structure and performance of the MOS transistor of the present invention. That is because the overall thickness of the source and drain electrodes, above surfaces 101, 102, respectively, partly controls the formation of the semiconductor junctions which extend between the electrodes and substrate 31. For the purposes of the present invention, it is desirable that the source and drain gaps 115, 116, respectively have a depth (indicated at "D" in FIG. 8) of at least 1,500-angstroms and preferably greater than 2,000-angstroms.

Figure 9:
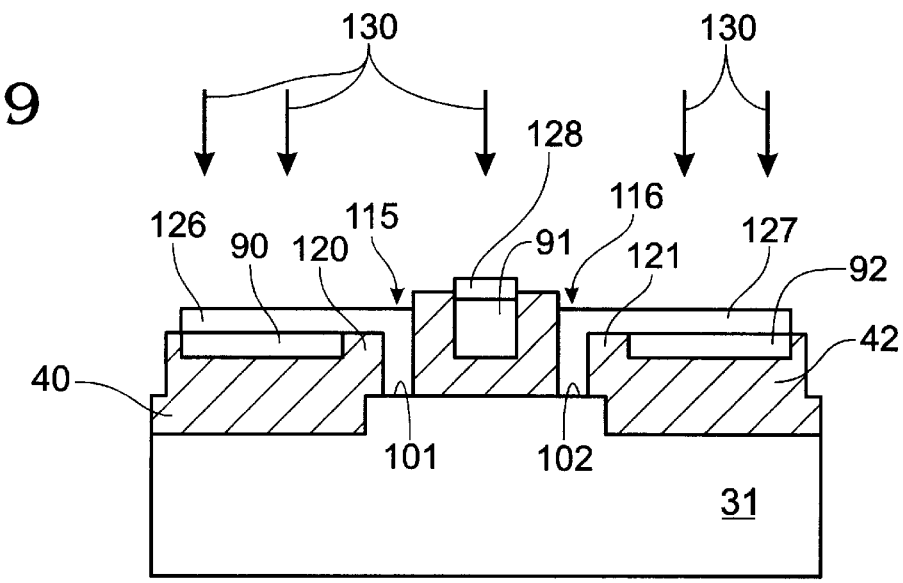

FIG. 9 illustrates the structure after the step of depositing semiconductor material in gaps 115, 166 is performed. The semiconductor material deposited in the source and drain gaps 115, 116, respectively, is preferably polycrystalline silicon, which is used to form the source and drain electrodes. Polycrystalline silicon is also deposited over polycrystalline silicon segments 90, 92 and over the short side wall segments 120, 121 of field insulation regions 40, 42, respectively. The structure shown in FIG. 9 includes a continuous region of deposited polycrystalline silicon 126 extending from the surface 101 of substrate 31 to and over polycrystalline silicon segment 90. The structure also includes a continuous region of deposited polycrystalline silicon 127 extending from the surface 102 of substrate 31 to and over polycrystalline silicon segment 92. Polycrystalline silicon 128 is also deposited on gate polycrystalline silicon 91, increasing the thickness of the gate electrode.

Following the addition of polycrystalline silicon segments 126, 127, 128 as shown in FIG. 9, the next step in the method is the implantation step in which doping impurities are implanted into the polycrystalline silicon electrodes. The implantation step is illustrated schematically in FIG. 9 by arrows 130. In the implantation step, appropriate resist (not shown) is applied to protect those surface areas which will not receive the doping impurities. In the structure of FIG. 9, doping impurities are directed through the top surfaces of polycrystalline silicon regions 126, 127, 128. The type of impurities implanted depends on the conductivity type of transistor being formed. For n-channel devices, electron donor impurities, such as phosphorus or arsenic, are implanted. The preferred implant dose for either phosphorus or arsenic, is generally in the range of $1 \times 10^{15}$ ions/cm$^2$ to $1 \times 10^{16}$ ions/cm$^2$. The suggested implant energy for phosphorous is generally in the range of 30 keV to 80 keV and the suggested implant energy for arsenic is generally in the range of 50 keV to 150 keV. For p-channel devices, electron acceptor impurities such as boron or BF$_2$ are implanted. The preferred implant dose for boron and BF$_2$ is generally in the range of $1 \times 10^{15}$ ions/cm$^2$ to $1 \times 10^{16}$ ions/cm$^2$. The suggested implant energy for boron is generally in the range of 5 keV to 50 keV, and for BF$_2$ is generally in the range of 50 keV to 200 keV.

Following the implantation step, the diffusion step is performed in which the structure of FIG. 9 is annealed to diffuse the implanted doping impurities through the polycrystalline silicon. The preferred method of diffusion is to subject the structure, after implantation of the appropriate doping impurities, to a rapid thermal anneal ("RTA"). The RTA is performed at a temperature generally in the range of 1050° C. to 1150° C. for between approximately 5- to 40-seconds. As will be understood by those skilled in the art, the anneal should be performed for a shorter time interval if the temperature is at or near the upper end of the specified temperature range and for a longer time interval if the temperature is at or near the lower end of the specified temperature range.

Figure 10:
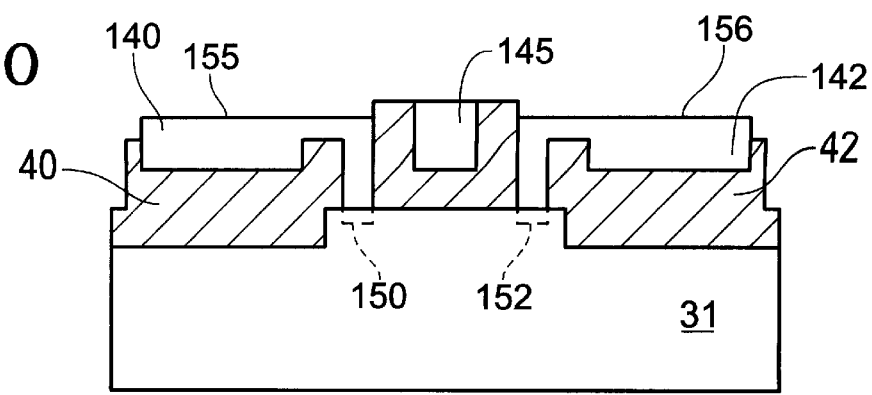

FIG. 10 illustrates the result of the diffusion step, which is alternatively referred to as the anneal step or the RTA step. In FIG. 10 polycrystalline silicon regions 90 and 126 (from FIG. 9) have been merged into a continuous body of doped polycrystalline silicon 140, which is the source electrode of the transistor. Polycrystalline silicon regions 92 and 127 have been merged into a continuous body of doped polycrystalline silicon 142, which is the drain electrode of the transistor. And polycrystalline silicon regions 91 and 128 have been merged into a continuous body of doped polycrystalline silicon 145, which is the gate electrode of the transistor. The diffusion step which results in the structure shown in FIG. 10, in addition to dispersing doping impurities throughout polycrystalline silicon electrodes 140, 142, 145, also causes a shallow penetration of the doping impurities into substrate 31 as indicated by dashed-line regions 150, 152. Those regions are referred to herein as source junction region 150 and drain junction region 152 and their formation is described with reference to FIG. 11.

Figure 11:
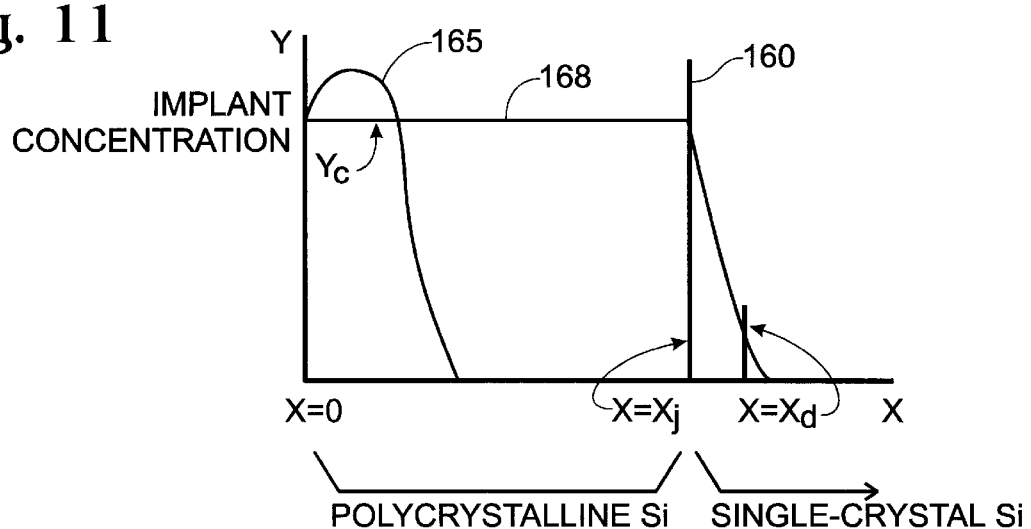
FIG. 11 is a graph showing the distribution of impurity dopants in the source/drain electrodes and in the regions of the source/drain junctions after the implantation step and also after the diffusion step.

FIG. 11 is a graph which shows the distribution of doping impurities in the polycrystalline silicon of source/drain electrodes 140, 142, and in the single-crystal silicon of substrate 31, before and after the diffusion step. The vertical axis (y axis) shows the implant concentration in the semiconductor material and the horizontal axis (x axis) shows distance as measured from the top surface 155, 156 (see FIG. 10) of source and drain electrodes 140, 142, respectively. The left edge of the horizontal axis (x=0) is the surface 155, 156 of the electrodes, and line 160 represents the interface junction ($x=x_j$) where the polycrystalline silicon electrodes contact the single crystal silicon substrate 31 (at surfaces 101, 102 in FIG. 9). Curve 165 in FIG. 11 shows the distribution of doping impurities in source/drain electrodes 140, 142 following the implantation step described above with reference to FIGS. 8 and 9. Curve 168 shows the distribution of doping impurities in the source/drain electrodes and in substrate 31 after the diffusion step (i.e., the annealing step).

As can be seen from curve 165 in FIG. 11, after the implanting step and before annealing the doping impurities are concentrated just below the surface of the polycrystalline silicon electrodes. After the diffusion step curve 168 shows that the distribution of doping impurities is approximately uniform throughout the polycrystalline silicon of source/drain electrodes 140, 142. At the interface junction 160 the distribution curve 168 rapidly declines to zero. The portion of curve 168 to the right of line 160 represents doping impurities diffused into the single crystal silicon of substrate 31. Semiconductor doping impurities are known to diffuse rapidly in polycrystalline silicon and much more slowly in single crystal silicon. The speed of diffusion is believed to differ by a factor of 100 to 1 (i.e., impurities diffuse 100 times faster in polycrystalline silicon). The present invention takes advantage of this difference in propagation speed to produce relatively heavily doped source/drain electrodes and thin adjacent regions, within the singlecrystal substrate, which are lightly doped. This is accomplished by providing polycrystalline silicon electrodes which are relatively thick (2000 Å to 5000 Å) in the areas overlying the junctions, doping the electrodes as specified above, and then performing a controlled RTA to control the depth to which the impurities diffuse into the junction regions of the substrate. The methodology of the present invention produces impurity distributions generally as shown by curve 168, although it should be understood that FIG. 11 is not to scale.

In the example of curve 168, a typical impurity concentration within the polycrystalline silicon of electrodes 140, 142 after anneal is approximately $1 \times 10^{20}$ ions/cm$^3$, i.e., $y_c = 1 \times 10^{20}$ ions/cm$^3$. To the right of line 160 in FIG. 11, within substrate 31, the impurity concentration rapidly drops off to zero. The depth of effective impurity diffusion into the single crystal silicon substrate 31 is referred to herein as the junction depth. In FIG. 11, $x_d$ is the point below the surface of substrate 31 where the concentration of doping impurities drops below approximately $1 \times 10^{16}$ ions/cm$^3$ to $1 \times 10^{17}$ ions/cm$^3$. The junction depth (i.e., $X_d - x_j$) in the preferred embodiment of the present invention is generally in the range of 100-angstroms to 1,000-angstroms and, more preferably 500-angstroms or less.

Figure 12:
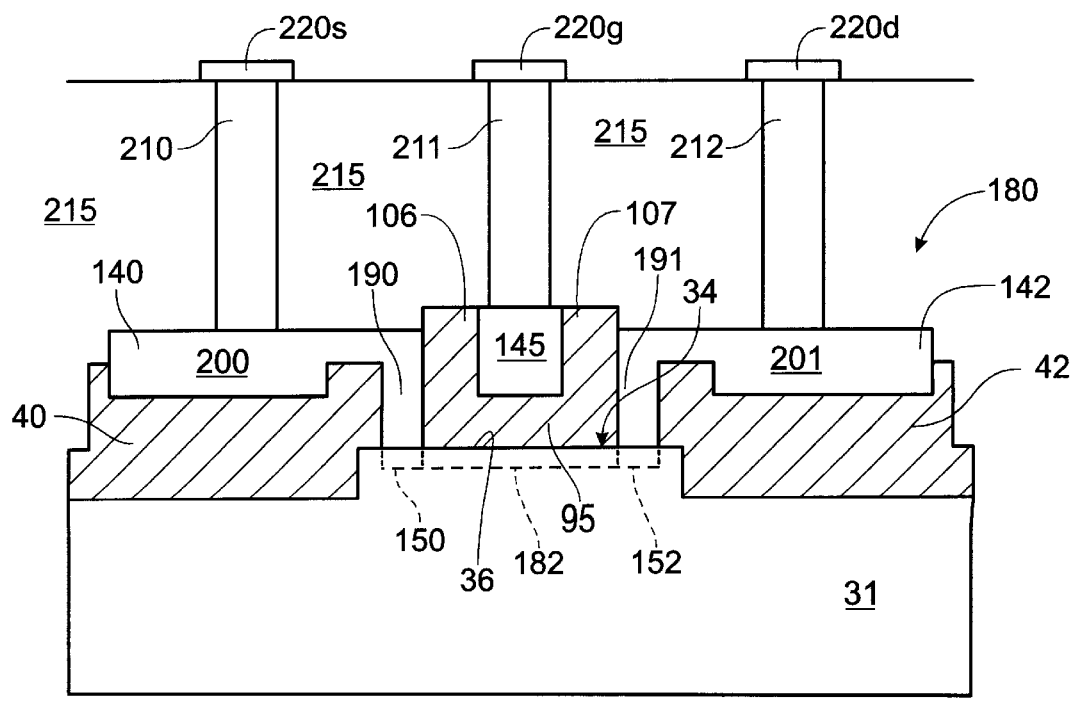
FIG. 12 is a cross-sectional view of a MOS transistor fabricated in accordance with the present invention.

FIG. 12 illustrates the MOS transistor of the present invention, together with surface metal interconnects, resulting from the foregoing fabrication method. FIG. 12 shows MOS transistor 180 formed on a single crystal silicon substrate 31 having an active region 34 isolated from adjacent active regions (not shown) by field insulation regions 40, 42. A gate 145 is formed centrally on active region 34 of substrate 31. The gate includes gate insulation 95 preferably formed of oxide material such as silicon dioxide overlying the channel region of the transistor (indicated by dashed line 182). The gate insulation 95 includes side walls 106, 107 and each (the gate insulation and the side walls) is preferably between approximately 70-angstroms to 500-angstroms thick, with a typical thickness being approximately 200-angstroms.

Immediately adjacent the gate insulation 95 of gate electrode 145, adjacent side wall 106, is source electrode 140. Drain electrode 142 is on the opposite side of the gate electrodes adjacent side wall 107. Source and drain electrodes 140, 142 are formed of polycrystalline silicon implanted with doping impurities which are diffused through the polycrystalline silicon in the manner described above. Polycrystalline silicon gate electrode 145 is preferably implanted with doping impurities in the same manner as source/drain electrodes 140, 142 and is positioned between the source and drain electrodes, and electrically insulated therefrom, by the gate oxide 95 and side walls 106, 107.

Within substrate 31, immediately adjacent the junction between source electrode 140 and the substrate, is a source junction region 150 which includes doping impurities diffused into the substrate during the diffusion step previously described. Immediately adjacent the junction between drain electrode 142 and the substrate is a drain junction region 152 which includes doping impurities diffused into the substrate during the diffusion step previously described. The part of source electrode 140 immediately overlying source junction region 150 (i.e., the thickest part of the source electrode, adjacent side wall 106) is referred to herein as the source strap 190. Similarly, the part of drain electrode 142 immediately overlying drain junction region 152 (i.e., the thickest part of the drain electrode, adjacent side wall 107) is referred dr herein as the drain strap 191. As was discussed above with respect to FIGS. 10, and 11, the thickness of the source and drain straps, together with the implantation and diffusion steps, controls the junction depth ($x_d - x_j$ in FIG. 11) of the source/drain junction regions 150, 152, respectively.

The use of relatively thick source and drain straps 190, 191, together with a carefully controlled RTA of approximately 40 seconds or less allows the process to achieve a relatively thin, substantially uniform junction region adjacent each of the source-drain electrodes. The junction regions 150, 152 have impurity doping concentrations which rapidly decline with distance from the overlying electrode, which means that, on average, the doping impurity concentration in the junction regions is substantially less than in the polycrystalline silicon source/drain electrodes 140, 142. Consequently, the thin, lightly doped junction regions each have a higher sheet resistance than the source and drain electrodes, which increases the breakdown voltage of the MOS transistor.

The preferred thickness of source electrode 140 and drain electrode 142 in their respective strap regions 190, 191 is generally in the range of 2,000-angstroms to 5,000-angstroms. The source and drain electrodes, as well as gate electrode 145, are preferably implanted with a dose of doping impurities, of the appropriate conductivity type, generally in the range of $1\times10^{15}$ ions/cm$^2$ to $1\times10^{16}$ ions/cm$^2$. The implanted doping impurities are diffused through the polycrystalline silicon and into the substrate by RTA at a temperature generally in the range of 1050° C. to 1150° C. for between approximately 5- to 40-seconds. As a result of the diffusion and the fact that doping impurities diffuse through polycrystalline silicon at approximately 100 times the rate of diffusion through single crystal silicon, the doping impurities diffuse only a short distance into the substrate 31 to form the source and drain junction regions 150, 152, respectively. The junction depth of the source and drain junction regions formed by this process is generally in the range of 100-angstroms to 1,000-angstroms and, more typically, less than 500-angstroms.

The source and drain electrodes 140, 142, include, in addition to strap regions 190, 191, raised interconnect portions which extend over the adjacent field insulation regions 40, 42, respectively. Source electrode 140 includes a source interconnect 200 made of polycrystalline silicon which extends outward (to the left, as viewed in FIG. 12) from source strap 190 over the field insulation region 40. Drain electrode 142 includes a drain interconnect 201 made of polycrystalline silicon which extends outward (to the right, as viewed in FIG. 12) from drain strap 191 over the field insulation region 42. The source and drain interconnects 200, 201, respectively, provide broad surfaces for completing external connections. Because the interconnects overlie the field insulation regions 40, 42, they do not contribute to the junction area between the heavily-doped electrodes 140, 142 and substrate 31. The present invention minimizes the area of electrode/substrate junction, such junctions being found only beneath straps 190, 191. Since parasitic capacitance in a MOS transistor increases in proportion to the junction area between heavily doped electrodes and the substrate, the design of the present invention minimizes parasitic capacitance.

FIG. 12 also shows suitable external electrode connections for an operational MOS transistor. Metal source, gate, and drain interconnects 210, 211, 212, respectively, are formed in operative contact with the source, gate, and drain electrodes 140, 145, 142, respectively. The metal interconnects 210, 211, 212 are electrically isolated from one another by suitable insulating material, such as surrounding oxide 215. Contact pads 220s, 220g, and 220d are installed on interconnects 210, 211, and 212, respectively, for external connections. The broad interconnect areas 200, 201, of source and drain electrodes 140, 142, respectively, simplify the completion of operative connections between the electrodes and metal interconnects 210, 212 because interconnects 200, 201 overlie relatively thick field insulation regions 40, 42. Consequently, even if a metal spike should penetrate through the source or drain electrode, it is less likely to destroy the device.

The MOS transistor of the present invention minimizes the source/substrate and drain/substrate junction areas, thereby minimizing the parasitic capacitance of the transistor. Thin, lightly-doped source and drain junction regions 150, 152 introduce regions of higher sheet resistance adjacent the channel region 182 of the transistor, thereby increasing the threshold voltage of the device and improving breakdown performance. Moreover, the thin junction regions are created without the need for additional masking and processing steps. As such, the invention offers a simplified fabrication method which reduces cost and increases yield.

As noted above in the discussion of the method of the present invention, the MOS transistor can be fabricated as either a n-channel or a p-channel device, depending on the type of semiconductor material and doping impurities employed. As will be readily understood, the designation of the source and drain in the foregoing description is arbitrary and the designations of those electrodes may be reversed. Other variations within the scope of the present invention will occur to those skilled in the art.

What is claimed is:

1. A MOS transistor formed on a substrate including single crystal silicon in an active region of the substrate where the transistor is formed, the active region being separated by field insulation regions from other active regions on the substrate, the MOS transistor comprising:

a gate on the top surface of the active region of the substrate, including gate insulation on said substrate and a gate electrode on said gate insulation;

insulating side walls on opposite sides of said gate formed by anisotropic etching which removes insulating material from horizontal surfaces and leaves vertical insulating side walls, such that each said insulating side wall is a vertical surface of insulating material adjacent a horizontal surface area of the top surface, said vertical insulating side walls each having a thickness generally in the range of 70 Å to 500 Å;

a source electrode formed of polycrystalline silicon on said substrate, said source electrode including a source strap portion extending adjacent a vertical side wall of said gate and contacting the top surface of the active region adjacent said side wall and a source interconnect region extending over the adjacent field insulation region, said source strap portion being greater than 1500 Å thick measured perpendicularly to the surface of the substrate;

a drain electrode formed of polycrystalline silicon on said substrate on the opposite side of said gate from said source electrode, said drain electrode including a drain strap portion extending adjacent the vertical side wall of said gate and contacting the top surface of the active region adjacent said side wall and a drain interconnect region extending over the adjacent field insulation region, said drain strap portion being greater than 1500 Å thick measured perpendicularly to the surface of the substrate;

said source and drain interconnect regions being where the respective source and drain electrodes are connected to external MOS transistor interconnects;

said source and drain electrodes being implanted with doping impurities which are diffused through the polycrystalline silicon of said source and drain electrodes and into the single crystal silicon of the substrate;

a source junction region in the substrate beneath where the source strap portion of said source electrode contacts the top surface of the substrate, said source junction region having a junction depth which is the depth the doping impurities diffuse from the overlying source strap portion of said source electrode into the substrate;

a drain junction region in the substrate beneath where the drain strap portion of said drain electrode contacts the top surface of the substrate; said drain junction region having a junction depth which is the depth the doping impurities diffuse from the overlying drain strap portion of said drain electrode into the substrate; and said junction depth for each said source and drain junction region being a fraction of the thickness of the strap portion of the overlying electrode based on the substantially lower rate of impurity diffusion through single crystal silicon verses polycrystalline silicon, whereby thin junction regions are produced.

2. A MOS transistor as in claim 1 in which said source and drain junction regions each have a junction depth generally in the range of 100 Å to 1000 Å.

3. A MOS transistor as in claim 1 in which the thickness of said source strap portion of said source electrode and said drain strap portion of said drain electrode is generally in the range of 2000 Å to 5000 Å and the polycrystalline silicon forming said electrodes is implanted with a dose of doping impurities generally in the range of $1\times10^{15}$ to $1\times10^{16}$ ions/cm$^2$.

4. A MOS transistor as in claim 3 in which said source and drain electrodes are annealed to diffuse the doping impurities through said electrodes and into said respective source and drain junction regions to produce junction regions having a junction depth generally in the range of 100 Å to 1000 Å.

5. A MOS transistor as in claim 1 including insulating material extending into said substrate to isolate the active region, and wherein said source electrode includes a source strap which is the portion of said source electrode overlying said source junction region and having said predetermined electrode thickness, and said drain electrode includes a drain strap which is the portion of said drain electrode overlying said drain junction region and having said predetermined electrode thickness, said source electrode further including a source interconnect portion operatively connected to said source strap, said source interconnect extending over said insulating material such that said insulating material separates said source interconnect from said substrate, and said drain electrode further including a drain interconnect portion operatively connected to said drain strap, said drain interconnect extending over said insulating material such that said insulating material separates said drain interconnect from said substrate, whereby the junctions between said source and drain electrodes and said substrate are generally limited to said respective source and drain junction regions to minimize parasitic capacitance in the transistor.

6. A MOS transistor as in claim 1 in which said source and drain interconnect regions are thinner than the respective source and drain strap portions.

7. A MOS transistor as in claim 1 in which said source interconnect region extends from said source strap portion generally away from said side wall of said gate, and said drain interconnect region extends from said drain strap portion generally away from said side wall of said gate.

8. A MOS transistor as in claim 1 in which said source strap and drain strap portions each have a thickness generally in the range of 2000 Å to 5000 Å, the polycrystalline silicon forming said source and drain electrodes is implanted with a dose of doping impurities generally in the range of $1\times10^{15}$ to $1\times10^{16}$ ions/cm$^2$, and said source and drain electrodes are annealed following implantation of doping impurities for between generally 5 seconds and 40 seconds at a temperature generally in the range of 1050° C. to 1150° C. to diffuse the doping impurities through the electrodes and into the respective source and drain junction regions.

9. A MOS transistor as in claim 8 in which said source and drain junction regions each have a junction depth generally in the range of 100 Å to 1000 Å.

10. A MOS transistor as in claim 8 in which said source and drain junction regions each have a junction depth of less than 500 Å.

* * * * *